United States Patent [19]

Fussgaenger et al.

[11] 3,737,828

[45] June 5, 1973

[54] RADIATION DETECTOR

[75] Inventors: Kurt Fussgaenger; Johannes Rachmann; Klaus Mettler, all of Munich, Germany

[73] Assignee: Siemens Aktiengesellschaft, Berlin and Munich, Germany

[22] Filed: May 19, 1971

[21] Appl. No.: 144,756

[30] Foreign Application Priority Data

May 26, 1970 Germany....................P 20 25 773.2

[52] U.S. Cl.....................................338/18, 250/83.3

[51] Int. Cl. ...............................................H01c 7/08

[58] Field of Search ..................338/15, 18; 252/501, 252/518, 521; 317/235 N, 235 Q; 250/83, 83.3

[56] References Cited

UNITED STATES PATENTS

| | | | |
|---|---|---|---|
| 3,508,126 | 4/1970 | Newman et al. | 317/235 N |
| 3,391,308 | 7/1968 | Miller | 317/235 AQ |
| 3,387,163 | 6/1968 | Queisser | 317/235 AQ |
| 3,465,176 | 9/1969 | Tanaka et al. | 317/235 AQ |
| 3,271,637 | 9/1966 | Webb | 317/235 AQ |
| 3,575,628 | 4/1971 | Word | 317/235 N X |
| 3,138,495 | 6/1964 | Bylander et al. | 317/235 AQ |
| 3,533,967 | 10/1970 | McNeely et al. | 252/501 X |
| 3,366,793 | 1/1968 | Svedberg | 317/235 AQ |
| 3,537,029 | 10/1970 | Kressel et al. | 317/235 N |

*Primary Examiner*—C. L. Albritton
*Attorney*—Hill, Sherman, Meroni, Gross & Simpson

[57] ABSTRACT

An electromagnetic radiation detector for successive high frequency short impulse radiations, as from a $CO_2$ laser having a 10.6 $\mu$m wave length. The detector device includes a uniform semiconductor material of gallium arsenide doped with Cu, Ge, Li, or Mn.

4 Claims, 1 Drawing Figure

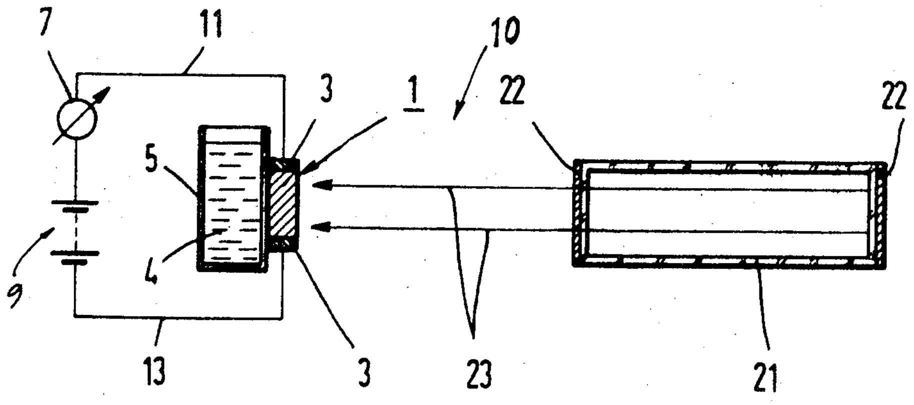
INVENTORS
KURT FUSSGAENGER
JOHANNES RACHMANN
KLAUS METTLER
BY Hill, Sherman, Meroni, Gross & Simpson ATTORNEYS

RADIATION DETECTOR

BACKGROUND OF THE INVENTION

1. Field of the Invention

The invention relates to radiation detectors and more particularly to electromagnetic radiation detectors of very short impulses, such as from a $CO_2$ laser having a 10.6 $\mu$m wave length.

2. Prior Art

Some electromagnetic radiation detectors composed of semiconductor materials, such as gold-doped germanium and mercury-cadmium telluride are known. The prior art detectors are used to detect short impulse radiation from $CO_2$ lasers and to receive information-modulated electromagnetic radiation produced with the aid of $CO_2$ lasers. It is of particular importance that such detectors be capable of resolving very short radiation impulses of successive high frequency, such as in the approximate range of GHz. Detectors receiving this type of information must have a high sensitivity for the radiation to be received and must have extremely small interfering characteristics (noise) of their own. The prior art detectors are somewhat deficient in providing the desired characteristics and the invention provides improved detectors.

SUMMARY OF THE INVENTION

The invention provides a radiation sensitive detector device including a radiation sensitive material comprised of a uniform semiconductor material including a doped gallium arsenide. The preferred doping materials are selected from the group consisting essentially of Cu, Ge, Li, and Mn at suitable concentrations and preferably concentrations of about $10^{17}$ through $10^{18}$ $cm^{-3}$.

BRIEF DESCRIPTION OF THE DRAWING

The single FIGURE essentially comprises a schematic illustration of the invention in an operational environment.

DESCRIPTION OF THE PREFERRED EMBODIMENTS

The invention provides a radiation-sensitive detector device particularly useful in detecting successive high frequency impulses of a laser, such as a $CO_2$ laser having a wave length of 10.6 $\mu$m. The radiation-sensitive detector device includes a semiconductor material containing a doped gallium arsenide characterized by a high sensitivity for information-modulated radiation produced with the aid of a laser, particularly a $CO_2$ laser and by a very small interfering (noise) characteristic of its own. The radiation-sensitive detector device of the invention is particularly useful for detecting electromagnetic radiation produced by a $CO_2$ laser having a 10.6 $\mu$m wave length.

The radiation-sensitive detector device contains a radiation-sensitive material comprised of a doped gallium arsenide. The preferred doping materials are selected from the group consisting essentially of Cu, Ge, Li and Mn at suitable concentrations. Preferably, the doping material is present in the gallium arsenide at concentrations of about $10^{17}$ through $10^{18}$ $cm^{-3}$.

The utility of the radiation-sensitive detector devices of the invention is surprising. Particularly the use of copper-doped gallium arsenide is unexpected at a 10.6 $\mu$m wave length. One would expect that the quantum energy of 117 meV of the radiation at a 10.6 $\mu$m wave length would not be sufficient to excite the acceptor level of copper in the gallium arsenide since it requires a quantum energy of 150 meV. However, unexpectedly, a radiation sensitive detector including copper-doped gallium arsenide material detects radiation of a $CO_2$ laser having a 10.6 $\mu$m wave length in a highly satisfactory manner.

An embodiment of the invention including a copper-doped gallium arsenide material as the radiation-sensitive material was studied. This exemplary embodiment was characterized by dimensions of 1.7 × 1.7 mm and a thickness of 0.8 mm. In an operational environment, this exemplary embodiment had a dark resistance of about 3 Ω at the temperature of liquid nitrogen and a copper doping concentration of $3 \times 10^{17}$ $cm^{-3}$.

Referring now to the drawing, a radiation-sensitive detector device 1 is shown in an operational environment 10. A pair of electrodes 3 are operationally associated with the detector device 1 so as to enable it to function as a radiation-sensitive element. The detector device is, as shown, a uniform element. The detector device 1 is also operationally associated with a heat-exchange means 5. The heat exchange means 5 is provided with liquid nitrogen 4 and during operation cools the detector device 1 down to the temperature of liquid nitrogen.

A conventional laser, such as a $CO_2$ laser 21, having properly arranged mirrors 22 is operationally positioned so as to produce radiation 23 that impinges on the detector device 1.

A suitable voltage source 9 is interconnected by conduits 11 and 13 with the detector device 1 so that upon activation, a current flows through the device 1. A means 7 for detecting current changes, such as an oscilloscope or the like, is operationally connected between one of the electrodes 3 and the voltage source 9 via one of the conduits 11.

Upon activation of the operational environment 10 the detector device 1 is cooled and provided with a current flow. The radiation produced, for example by activation of the $CO_2$ laser 21 producing a 10.6 $\mu$m wave length, impinges on the detector device 1 and causes a change in the dark resistance of the semiconductor material (i.e. doped gallium arsenide) in the detector device 1. This change is observed with the aid of means 7.

It will be understood that modifications and variations may be effected without departing from the spirit and scope of the novel concepts of the present invention.

We claim as our invention:

1. A radiation detector device for short impulse electromagnetic radiation of a $CO_2$ laser having a 10.6 $\mu$m wavelength including a uniform element consisting of a gallium arsenide material doped with a doping material selected from the group consisting of Cv, Ge, Li and Mn.

2. A radiation detector as defined in claim 1 wherein the concentration of the doping material in the gallium arsenide material ranges from about $10^{17}$ through $10^{18}$ $cm^{-3}$.

3. A radiation detector as defined in claim 1 wherein the element is composed of copper-doped gallium arsenide having a copper concentration of $3 \times 10^{17}$ $cm^{-3}$.

4. A radiation detector device for short impulse electromagnetic radiation of a $CO_2$ laser having a 10.6 $\mu$m wavelength including a uniform element consisting of gallium arsenide material doped with copper in a concentration ranging from about $10^{17}$ – $10^{18}$ $cm^{-3}$.

* * * * *